US010243385B2

United States Patent
MirTabatabaei et al.

(10) Patent No.: US 10,243,385 B2
(45) Date of Patent: *Mar. 26, 2019

(54) SECONDARY BATTERY MANAGEMENT SYSTEM

(71) Applicant: Robert Bosch GmbH, Stuttgart (DE)

(72) Inventors: Anahita MirTabatabaei, San Francisco, CA (US); Reinhardt Klein, Mountain View, CA (US); Aleksandar Kojic, Sunnyvale, CA (US); Nalin Chaturvedi, Union City, CA (US); Christopher Mayhew, Redondo Beach, CA (US); John F. Christensen, Elk Grove, CA (US)

(73) Assignee: Robert Bosch GmbH, Stuttgart (DE)

( * ) Notice: Subject to any disclaimer, the term of this patent is extended or adjusted under 35 U.S.C. 154(b) by 81 days.

This patent is subject to a terminal disclaimer.

(21) Appl. No.: 15/011,118

(22) Filed: Jan. 29, 2016

(65) Prior Publication Data

US 2017/0222448 A1     Aug. 3, 2017

(51) Int. Cl.
*H02J 7/00*     (2006.01)
*H02J 7/14*     (2006.01)
(Continued)

(52) U.S. Cl.
CPC ............... *H02J 7/007* (2013.01); *B60L 3/12* (2013.01); *G01R 31/3624* (2013.01);
(Continued)

(58) Field of Classification Search
USPC ....... 320/124, 125, 127, 128, 132, 134, 135, 320/136, 137, 138, 141, 142, 148
See application file for complete search history.

(56) References Cited

U.S. PATENT DOCUMENTS

| 6,515,456 B1 * | 2/2003 | Mixon | H02J 7/0075 320/137 |
|---|---|---|---|
| 6,534,954 B1 | 3/2003 | Plett | |

(Continued)

FOREIGN PATENT DOCUMENTS

| DE | 102005008511 A1 | 8/2006 |
|---|---|---|
| EP | 2816366 A1 | 12/2014 |

(Continued)

OTHER PUBLICATIONS

B. F. Lund and B. A. Foss, "Parameter ranking by orthogonalization—Applied to nonlinear mechanistic models," Automatica, vol. 44, No. 1, pp. 278-281, 2008.

(Continued)

*Primary Examiner* — Alexis Pacheco
(74) *Attorney, Agent, or Firm* — Michael Best & Friedrich LLP

(57) ABSTRACT

A method of managing a battery system, the method including receiving at least one measured characteristic of the at least one battery cell from the at least one sensor, estimating at least one state of the at least one battery cell at a first time by applying an electrochemical-based battery model, estimating at least one physical parameter of the at least one battery cell based on the at least one measured characteristic and the estimation of the at least one state, estimating the at least one state at a second time, subsequent to the first time, by applying the electrochemical-based battery model based on the estimated at least one parameter, and regulating at least one of charging or discharging of the at least one battery cell based on the estimation of the at least one state.

16 Claims, 3 Drawing Sheets

(51) Int. Cl.
- *G01R 31/36* (2019.01)
- *H01M 10/42* (2006.01)
- *H01M 10/48* (2006.01)
- *B60L 3/12* (2006.01)
- *B60L 11/18* (2006.01)

(52) U.S. Cl.
CPC ..... *G01R 31/3651* (2013.01); *G01R 31/3679* (2013.01); *H01M 10/425* (2013.01); *H01M 10/48* (2013.01); *H01M 10/482* (2013.01); *B60L 11/1861* (2013.01)

(56) References Cited

U.S. PATENT DOCUMENTS

| | | | |
|---|---|---|---|
| 7,612,532 | B2 | 11/2009 | Verbrugge |
| 8,008,891 | B2 | 8/2011 | Yun et al. |
| 8,103,485 | B2 | 1/2012 | Plett |
| 8,116,998 | B2 | 2/2012 | Hess |
| 8,188,715 | B2 | 5/2012 | Christensen et al. |
| 8,310,201 | B1 | 11/2012 | Wright |
| 8,321,164 | B2 | 11/2012 | Liu et al. |
| 8,346,495 | B2 | 1/2013 | Gering |
| 8,467,984 | B2 | 6/2013 | Gering |
| 8,548,762 | B2 | 10/2013 | Prada et al. |
| 8,635,038 | B2 | 1/2014 | Benjamin et al. |
| 8,896,315 | B1 | 11/2014 | Davies |
| 8,965,723 | B2 | 2/2015 | Jo et al. |
| 9,086,462 | B2 | 7/2015 | Mao |
| 2001/0032666 | A1 | 10/2001 | Jenson et al. |
| 2002/0097026 | A1* | 7/2002 | Kernahan ............ H02J 7/1438 322/28 |
| 2003/0076109 | A1 | 4/2003 | Verbrugge et al. |
| 2004/0135548 | A1* | 7/2004 | Takano ................. H02J 7/047 320/132 |
| 2004/0220758 | A1 | 11/2004 | Barsoukov et al. |
| 2006/0111854 | A1 | 5/2006 | Plett |
| 2006/0170397 | A1 | 8/2006 | Srinivasan et al. |
| 2006/0284600 | A1 | 12/2006 | Verbrugge |
| 2007/0299620 | A1* | 12/2007 | Yun .................... B60L 11/1861 702/63 |
| 2008/0074082 | A1 | 3/2008 | Tae et al. |
| 2008/0103709 | A1 | 5/2008 | Yun et al. |
| 2008/0281244 | A1 | 11/2008 | Jacobs |
| 2009/0210179 | A1 | 8/2009 | Tang et al. |
| 2009/0326842 | A1 | 12/2009 | Thomas-Alyea |
| 2010/0033132 | A1 | 2/2010 | Nishi et al. |
| 2011/0025258 | A1 | 2/2011 | Kim et al. |
| 2011/0288797 | A1 | 11/2011 | Schmidt |
| 2012/0101753 | A1 | 4/2012 | Lin et al. |
| 2012/0105001 | A1 | 5/2012 | Gallegos et al. |
| 2012/0150507 | A1 | 6/2012 | Gallestey et al. |
| 2012/0175953 | A1 | 7/2012 | Ohkawa et al. |
| 2012/0299552 | A1* | 11/2012 | Machida ................ H02J 7/04 320/138 |
| 2012/0306438 | A1* | 12/2012 | Howard ................ A42B 3/046 320/107 |
| 2013/0006454 | A1 | 1/2013 | Li et al. |
| 2013/0051587 | A1 | 2/2013 | Stephanou et al. |
| 2013/0085696 | A1 | 4/2013 | Xu et al. |
| 2013/0086409 | A1 | 4/2013 | Lu et al. |
| 2013/0300190 | A1* | 11/2013 | Mao .................... G01R 31/3624 307/9.1 |
| 2013/0300377 | A1 | 11/2013 | Mao et al. |
| 2013/0322488 | A1 | 12/2013 | Yazami et al. |
| 2014/0089692 | A1 | 3/2014 | Hanafusa |
| 2014/0222358 | A1 | 8/2014 | Morita et al. |
| 2014/0225620 | A1 | 8/2014 | Campbell et al. |
| 2014/0229129 | A1 | 8/2014 | Campbelle et al. |
| 2014/0236511 | A1 | 8/2014 | Kulkarni et al. |
| 2014/0244225 | A1 | 8/2014 | Balasingam et al. |
| 2014/0278167 | A1 | 9/2014 | Frost et al. |
| 2014/0342193 | A1 | 11/2014 | Mull et al. |
| 2014/0350877 | A1 | 11/2014 | Chow et al. |
| 2015/0046106 | A1 | 2/2015 | Wade et al. |
| 2015/0066406 | A1 | 3/2015 | Sun et al. |
| 2015/0147608 | A1 | 5/2015 | Lin et al. |
| 2015/0197164 | A1 | 7/2015 | Lee |
| 2015/0226807 | A1 | 8/2015 | Aumentado et al. |
| 2015/0234013 | A1 | 8/2015 | Migita et al. |
| 2015/0248149 | A1 | 9/2015 | Yamazaki et al. |
| 2015/0251555 | A1 | 9/2015 | Li et al. |
| 2015/0251556 | A1 | 9/2015 | Meyer |
| 2015/0260800 | A1 | 9/2015 | Baba et al. |
| 2015/0268306 | A1 | 9/2015 | Sugiyama et al. |
| 2015/0302723 | A1 | 10/2015 | Reade et al. |
| 2015/0326038 | A1 | 11/2015 | Lee |
| 2016/0046199 | A1 | 2/2016 | Butler et al. |
| 2016/0090001 | A1* | 3/2016 | Nomoto ................. B60L 1/003 320/109 |
| 2016/0241058 | A1 | 8/2016 | Carralero et al. |
| 2016/0259011 | A1 | 9/2016 | Joe |
| 2017/0144562 | A1 | 5/2017 | Thomas et al. |
| 2017/0222449 | A1* | 8/2017 | MirTabatabaei ........ H02J 7/007 |
| 2017/0271984 | A1 | 9/2017 | Kohn et al. |

FOREIGN PATENT DOCUMENTS

| | | |
|---|---|---|
| KR | 20150043214 A | 4/2015 |
| WO | 2006057469 A1 | 6/2006 |
| WO | WO 2006/057468 | 6/2006 |
| WO | WO 2008/154956 | 12/2008 |
| WO | 2011050924 A1 | 5/2011 |
| WO | WO 2014/130519 | 8/2014 |
| WO | 2015025212 A1 | 2/2015 |
| WO | WO 2015/056963 | 4/2015 |
| WO | WO 2015/056964 | 4/2015 |
| WO | 2015185802 A1 | 12/2015 |

OTHER PUBLICATIONS

Ioannou et al., "Robust adaptive control." Courier Corporation, 2012.

K. Thomas, J. Newman and R. Darling, "Mathematical Modeling of Lithium Batteries," Kluwer Academic/Plenum Publishers, pp. 345-392, 2002.

Klein, R. et al., 2013. "Electrochemical Model Based Observer Design for a Lithium-Ion Battery." Control Systems Technology, IEEE Transactions on, 21(2), pp. 289-301.

M. Doyle, T.F. Fuller, J. Newman, "Modeling of Galvanostatic Charge and Discharge of the Lithium/Polymer/Insertion Cell", Journal of the Electrochemical Society, 1993.

Moura et al., "Adaptive PDE Observer for Battery SOC/SOH Estimation," ASME 2012 5th Annual Dynamic Systems and Control Conference joint with the JSME 2012 11th Motion and Vibration Conference, 2012 (10 pages).

Murray, Chapter 3, State Estimation, Caltech, (https://www.cds.caltech.edu/~murray/wiki/images/b/b3/Stateestim.pdf) available online as early as Sep. 20, 2006, pp. 9-17.

N. Chaturvedi, et al., "Modeling, estimation, and control challenges for lithium-ion batteries," 2010 American Control Conference, pp. 1997-2002, 2010.

N. Chaturvedi, J. Christensen, R. Klein and A. Kojic, "Approximations for Partial Differential Equations Appearing in Li-Ion Battery Models," ASME 2013 Dynamic Systems and Control Conference (10 pages).

N. Chaturvedi, R. Klein, J. Christensen, J. Ahmed and A. Kojic, "Algorithms for Advanced Battery Management Systems," IEEE Control Systems Magazine, vol. 30, No. 3, pp. 49-68, 2010.

Pattel, "An Evaluation of the Moving Horizon Estimation Algorithm for Online Estimation of Battery State of Charge and State" Thesis, Purdue University, Dec. 2014.

Ramadesigan et al., "Modeling and Simulation of Lithium-Ion Batteries from a Systems Engineering Perspective," Journal of the Electrochemical Society, 159 (3) R3 1-R45 (2012).

Rao, C. V., Rawlings, J. B., & Mayne, D. Q. (2003). "Constrained state estimation for nonlinear discrete-time systems: Stability and moving horizon approximations." Automatic Control, IEEE Transactions, 48(2), 246-258.

(56) References Cited

OTHER PUBLICATIONS

Tenny, M. J., & Rawlings, J. B. (2002). "Efficient moving horizon estimation and nonlinear model predictive control." In American Control Conference, 2002. Proceedings of the 2002 (vol. 6, pp. 4475-4480). IEEE.
Thomas, "Lithium-Ion Batteries: Thermal and Interfacial Phenomena," Dissertation, Princeton University, 1996, published 2002, pp. 66-73.
Written Opinion of the International Searching Authority for Application No. PCT/EP2017/051333 dated May 9, 2017 (10 pages).
Mayhew et al., "Investigation of projection-based model-reduction techniques for solid-phase diffusion in Li-ion batteries," American Control Conference (ACC), 2014 , pp. 123-128, Jun. 4-6, 2014.
Fuller et al., "Simulation and Optimization of the Dual Lithium Ion Insertion Cell," J. Electrochem. Soc., vol. 141, No. 1, Jan. 1994, pp. 1-10.
International Search Report for Application No. PCT/EP2017/051325 dated Apr. 7, 2017 (5 pages).
Ma Yan et al., "Lithium-ion Battery State of Charge Estimation based on Moving Horizon", Proceedings of the 11th World Congress on Intelligent Control and Automation, Jun. 29, 2014 (Jun. 29, 2014), Jul. 4, 2014 (Jul. 4, 2014), pp. 5002-5007.
Sridhar Ungarala, "Computing arrival cost parameters in moving horizon estimation using sampling based filters", Journal of Process Control, vol. 19, No. 9, Oct. 2009 (Oct. 2009), pp. 1576-1588.
Non-Final Office Action from the U.S. Patent and Trademark Office for U.S. Appl. No. 15/010,873 dated Aug. 31, 2018 (9 pages).
Notice of Allowance from the U.S. Patent and Trademark Office for U.S. Appl. No. 15/273,040 dated Feb. 4, 2019 (8 pages).

\* cited by examiner

SECONDARY BATTERY MANAGEMENT SYSTEM

STATEMENT REGARDING FEDERALLY SPONSORED RESEARCH

This invention was made with government support under ARPA-E Award No. DE-AR0000278 awarded by the U.S. Department of Energy. The U.S. government has certain rights in the invention.

FIELD

The invention generally relates to batteries, and more particularly to managing the operation of a battery.

BACKGROUND

Rechargeable lithium batteries are attractive energy storage devices for portable electric and electronic devices and electric and hybrid-electric vehicles because of their high specific energy compared to other electrochemical energy storage devices. A typical lithium cell contains a negative electrode, a positive electrode, and a separator located between the negative and positive electrodes. Both electrodes contain active materials that react with lithium reversibly. In some cases, the negative electrode may include lithium metal, which can be electrochemically dissolved and deposited reversibly. The separator contains an electrolyte with a lithium cation, and serves as a physical barrier between the electrodes such that none of the electrodes are electrically connected within the cell.

Typically, during charging, there is generation of electrons at the positive electrode and consumption of an equal amount of electrons at the negative electrode. During discharging, opposite reactions occur.

During repeated charge/discharge cycles of the battery undesirable side reactions occur. These undesirable side reactions result in the reduction of the capacity of the battery to provide and store power.

SUMMARY

Traditional approaches to managing the undesirable side reactions in a battery include limiting the rate of charge/discharge of the battery in an attempt to minimize the undesired effects. These efforts can result in extended charge times and peak power reduction. Thus, there is a need for a system and method for the determination of the states and parameters within a secondary battery allowing the battery management system to efficiently regulate the operation of the battery.

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

Embodiments of the disclosure are related to systems and methods for managing the operation of a secondary battery. For example, in one embodiment, a method of managing a battery system, the battery system including at least one battery cell, at least one sensor configured to measure at least one characteristic of the battery cell, and a battery management system including a microprocessor and a memory, the method includes receiving, by the battery management system, at least one measured characteristic of the at least one battery cell from the at least one sensor. The method also includes estimating, by the battery management system, at least one state of the at least one battery cell at a first time by applying an electrochemical-based battery model that accounts for physical parameters of a chemical composition of the at least one battery cell. The method also includes estimating, by the battery management system, at least one physical parameter of the at least one battery cell based on the at least one measured characteristic and the estimation of the at least one state. The method also includes estimating, by the battery management system, the at least one state of the at least one battery cell at a second time, subsequent to the first time, by applying the electrochemical-based battery model based on the estimated at least one parameter. The method also includes regulating, by the battery management system, at least one of charging or discharging of the at least one battery cell based on the estimation of the at least one state of the at least one battery cell.

In another embodiment, a battery management system comprising a processor and a memory storing instructions that, when executed by the processor, cause the battery management system to receive at least one measured characteristic of the at least one battery cell from the at least one sensor, the at least one measured characteristics including a characteristic selected from a group consisting of a current measurement of the at least one battery cell and a voltage measurement of the at least one battery cell, estimate at least one state of the at least one battery cell at a first time by applying a electrochemical-based battery model that account for physical parameters of a chemical composition of the at least one battery cell, estimate at least one physical parameter of the at least one battery cell based on the at least one measured characteristic and the estimation of the at least one state, estimate the at least one state of the at least one battery cell at a second time, subsequent to the first time, by applying the electrochemical-based battery model based on the estimated at least one parameter, and regulate at least one of charging or discharging of the at least one battery cell based on the estimation of the at least one state of the at least one battery cell.

The details of one or more features, aspects, implementations, and advantages of this disclosure are set forth in the accompanying drawings, the detailed description, and the claims below.

DETAILED DESCRIPTION

One or more specific embodiments will be described below. Various modifications to the described embodiments will be readily apparent to those skilled in the art, and the general principles defined herein may be applied to other embodiments and applications without departing from the spirit and scope of the described embodiments. Thus, the described embodiments are not limited to the embodiments shown, but are to be accorded the widest scope consistent with the principles and features disclosed herein.

Figure 1:
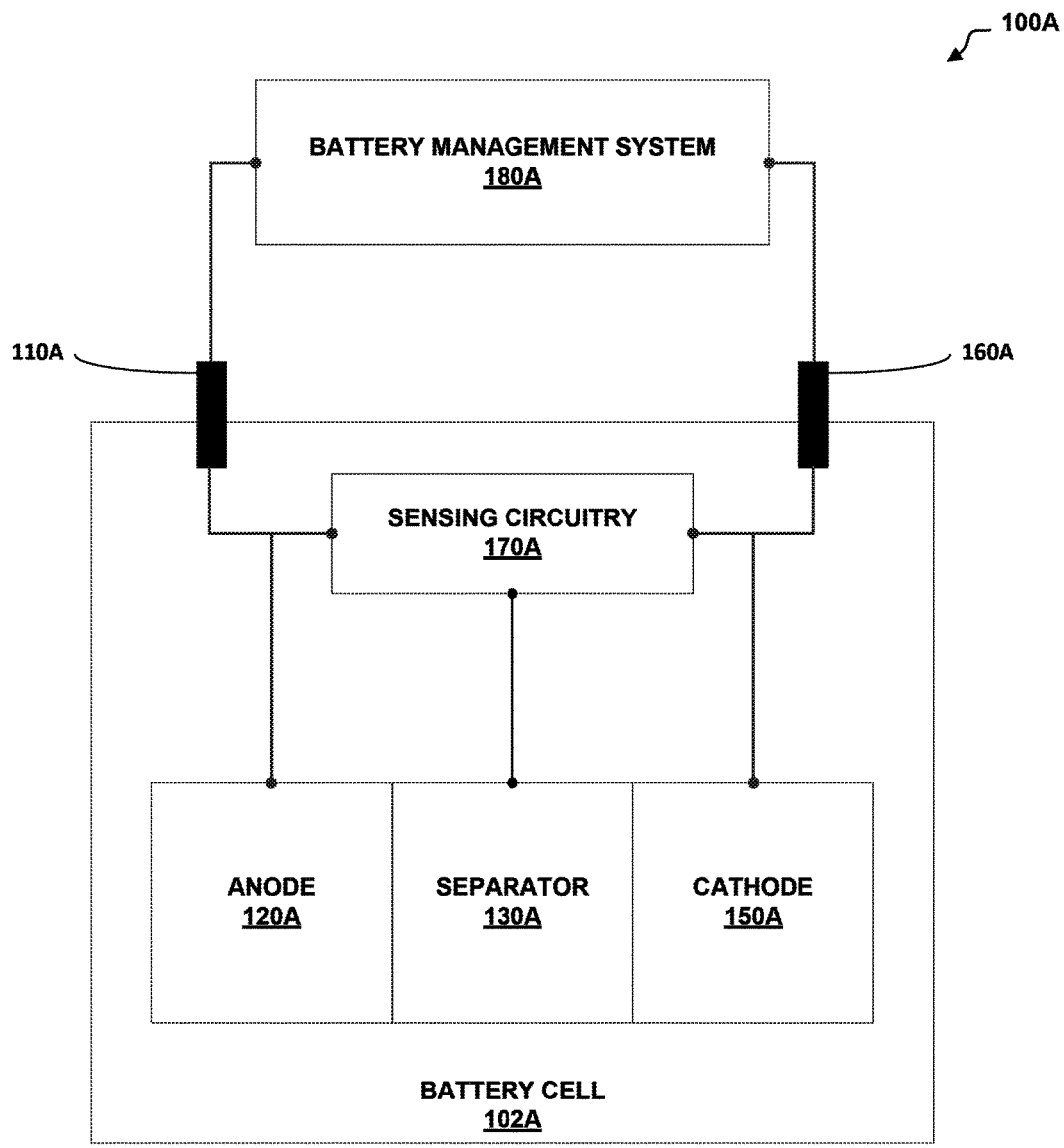
FIG. 1 is a block diagram of a battery system including a battery cell and a battery management system with sensing circuitry incorporated into the battery cell, in accordance with some embodiments.

An embodiment of a battery system 100A is shown in FIG. 1. The battery system 100A includes an anode tab 110A, an anode 120A, a separator 130A, a cathode 150A, a cathode tab 160A, sensing circuitry 170A, and a battery management system 180A. In some examples, the separator 130A may be an electrically insulating separator. In some embodiments, the electrically insulating separator comprises a porous polymeric film. In various embodiments the thickness dimension of the components of the battery cell 102A may be for the anode 120A about 5 to about 110 micrometers, for the separator 130A less than about 50 micrometers or in certain embodiments less than about 10 micrometers, and for the cathode 150A about 50 to about 110 micrometers.

During the discharge of battery cell 102A, lithium is oxidized at the anode 120A to form a lithium ion. The lithium ion migrates through the separator 130A of the battery cell 102A to the cathode 150A. During charging the lithium ions return to the anode 120A and are reduced to lithium. The lithium may be deposited as lithium metal on the anode 120A in the case of a lithium anode 120A or inserted into the host structure in the case of an insertion material anode 120A, such as graphite, and the process is repeated with subsequent charge and discharge cycles. In the case of a graphitic or other Li-insertion electrode, the lithium cations are combined with electrons and the host material (e.g., graphite), resulting in an increase in the degree of lithiation, or "state of charge" of the host material. For example, $x\ Li^+ + x\ e^- + C_6 \rightarrow Li_xC_6$.

The anode 120A may comprise an oxidizable metal, such as lithium or an insertion material that can insert Li or some other ion (e.g., Na, Mg, or other suitable ion). The cathode 150 may comprise various materials such as sulfur or sulfur-containing materials (e.g., polyacrylonitrile-sulfur composites (PAN-S composites), lithium sulfide ($Li_2S$)); vanadium oxides (e.g., vanadium pentoxide ($V_2O_5$)); metal fluorides (e.g., fluorides of titanium, vanadium, iron, cobalt, bismuth, copper and combinations thereof); lithium-insertion materials (e.g., lithium nickel manganese cobalt oxide (NMC), lithium-rich NMC, lithium nickel manganese oxide ($LiNi_{0.5}Mn_{1.5}O_4$)); lithium transition metal oxides (e.g., lithium cobalt oxide ($LiCoO_2$), lithium manganese oxide ($LiMn_2O_4$), lithium nickel cobalt aluminum oxide (NCA), and combinations thereof); lithium phosphates (e.g., lithium iron phosphate ($LiFePO_4$)).

The particles may further be suspended in a porous, electrically conductive matrix that includes polymeric binder and electronically conductive material such as carbon (carbon black, graphite, carbon fiber, etc.). In some examples, the cathode may comprise an electrically conductive material having a porosity of greater than 80% to allow the formation and deposition/storage of oxidation products such as lithium peroxide ($Li_2O_2$) or lithium sulfide, ($Li_2S$) in the cathode volume. The ability to deposit the oxidation product directly determines the maximum power obtainable from the battery cell. Materials which provide the needed porosity include carbon black, graphite, carbon fibers, carbon nanotubes, and other non-carbon materials. The pores of the cathode 150A, separator 130A, and anode 120A are filled with an ionically conductive electrolyte that contains a salt such as lithium hexafluorophosphate ($LiPF_6$) that provides the electrolyte with an adequate conductivity which reduces the internal electrical resistance of the battery cell. The electrolyte solution enhances ionic transport within the battery cell. Various types of electrolyte solutions are available including, non-aqueous liquid electrolytes, ionic liquids, solid polymers, glass-ceramic electrolytes, and other suitable electrolyte solutions.

The separator 130A may comprise one or more electrically insulating ionic conductive materials. In some examples, the suitable materials for separator 130A may include porous polymers (e.g. porous polyolefin), ceramics, and two dimensional sheet structures such as graphene, boron nitride, and dichalcogenides. In certain examples the pores of the separator 130A may be filled with an ionically conductive electrolyte that contains a lithium salt such as lithium hexafluorophosphate ($LiPF_6$) that provides the electrolyte with an adequate conductivity which reduces the internal electrical resistance of the battery cell.

The battery management system 180A is communicatively connected to the battery cell 102A. In one example, the battery management system 180A is electrically connected to the battery cell 102A via electrical links (e.g., wires). In another example, the battery management system 180A may be wirelessly connected to the battery cell 102A via a wireless communication network. The battery management system 180A may include for example a microcontroller (with memory and input/output components on a single chip or within a single housing) or may include separately configured components, for example, a microprocessor, memory, and input/output components. The battery management system 180A may also be implemented using other components or combinations of components including, for example, a digital signal processor (DSP), an application specific integrated circuit (ASIC), a field-programmable gate array (FPGA), or other circuitry. Depending on the desired configuration, the processor may include one more levels of caching, such as a level cache memory, one or more processor cores, and registers. The example processor core may include an arithmetic logic unit (ALU), a floating point unit (FPU), or any combination thereof. The battery management system 180A may also include a user interface, a communication interface, and other computer implemented devices for performing features not defined herein may be incorporated into the system. In some examples, the battery management system 180A may include other computer implemented devices such as a communication interface, a user interface, a network communication link, and an interface bus for facilitating communication between various interface devices, computing implemented devices, and one or more peripheral interfaces to the microprocessor.

In the example of FIG. 1, the memory of the battery management system 180A stores computer-readable instructions that, when executed by the electronic processor of the battery management system 180A, cause the battery management system and, more particularly the electronic processor, to perform or control the performance of various functions or methods attributed to battery management system 180A herein (e.g., calculate a state or parameter of the battery system, regulate the operation of the battery system, detect an internal short from a dendrite formation). The memory may include any transitory, non-transitory, volatile, non-volatile, magnetic, optical, or electrical media, such as a random access memory (RAM), read-only memory (ROM), non-volatile RAM (NVRAM), electrically-erasable programmable ROM (EEPROM), flash memory, or any other digital or analog media. The functions attributed to the battery management system 180A herein may be embodied as software, firmware, hardware or any combination thereof. In one example, the battery management system 180A may be embedded in a computing device and the sensing circuitry 170A is configured to communicate with the battery management system 180A of the computing device external to the battery cell 102A. In this example, the sensing circuitry 170A is configured to have wireless and/or wired communication with the battery management system 180A. For example, the sensing circuitry 170A and the battery management system 180A of the external device are configured to communicate with each other via a network. In yet another example, the battery management system 180A is remotely located on a server and the sensing circuitry 170A is configured to transmit data of the battery cell 102A to the battery management system 180A. In the above examples, the battery management system 180A is configured to receive the data and send the data to an electronic device for display as human readable format. The computing device may be a cellular phone, a tablet, a personal digital assistant (PDA), a laptop, a computer, a wearable device, or other suitable computing device. The network may be a cloud computing network, a server, a wireless area network (WAN), a local area network (LAN), an in-vehicle network, a cloud computing network, or other suitable network.

The battery management system 180A is configured to receive data from the sensing circuitry 170A including, for example, current, voltage, and/or resistance measurements. The sensing circuitry 170A may include one or more sensors. Each sensor of the sensing circuitry 170A may measure one or more characteristics (e.g., a current, a voltage, a resistance, and/or a temperature) of the battery cell 102A. The sensing circuitry 170A may be located internal to the battery cell 102A. The battery management system 180A is also configured to determine a condition of the battery cell 102A. Based on the determined condition of battery cell 102A, the battery management system 180A may alter the operating parameters of the battery cell 102A to maintain the internal structure of the battery cell 102A. The battery management system 180A may also notify a user of the condition of the battery cell 102A.

Figure 2:
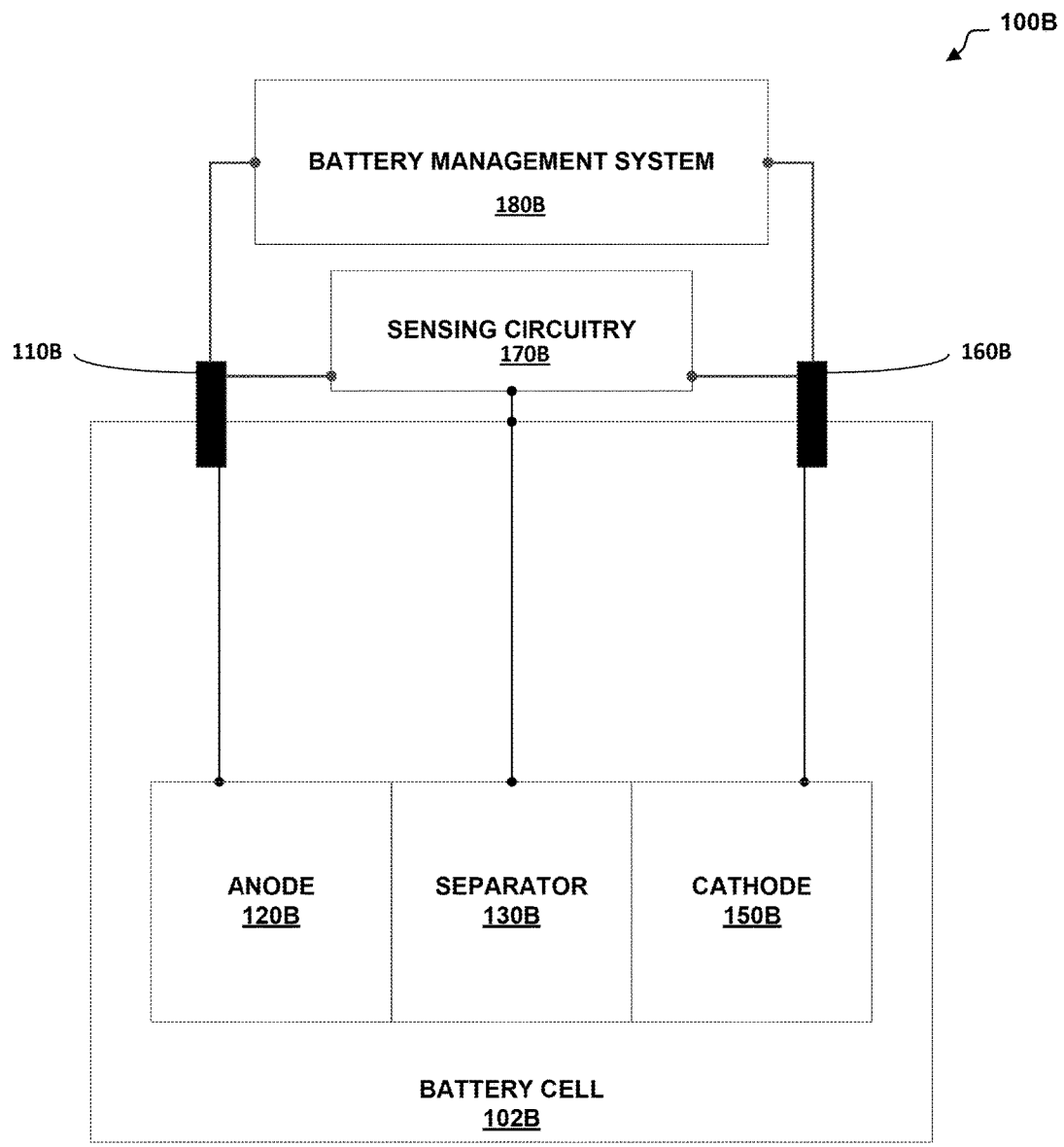
FIG. 2 is a block diagram of another battery system including a battery cell, a battery management system, and sensing circuitry located external to the battery cell, in accordance with other embodiments.

In other embodiments, the physical placement and configuration of various components may be modified. For example, FIG. 2 illustrates another example of a battery system 100B that includes a battery cell 102B, an anode tab 110B, an anode 120B, a separator 130B, a cathode 150B, a cathode tab 160B, sensing circuitry 170B, and a battery management system 180B. However, in the example of FIG. 2 the sensing circuitry 170B is external to the battery cell 102B and may be incorporated within the same housing as the battery management system 180B.

In some embodiments the battery cell 102A, 102B is part of a closed system. In a closed system, after the battery cell 102A, 102B is produced, the casing that surrounds the battery cell 102A, 102B is sealed to prevent external elements, such as air and moisture, from entering the battery cell 102A, 102B and potentially causing degradation of the battery cell 102A, 102B resulting in reduced performance and shorter life of the battery cell 102A, 102B. In the discussion below, examples that refer to components in both battery system 100A and battery system 100B will use the reference numeral without the A or B designation (e.g., anode 120 instead of anode 120A and anode 120B).

A battery cell 102 that is part of a closed system presents various challenges to the battery management system 180. The closed system does not allow the direct observation of the condition of the components of the battery cell 102. Instead, the sensing circuitry 170 monitors and/or measures characteristics (e.g., voltage, current, resistance, power, temperature and combinations thereof) of the battery cell 102 while the battery cell 102 is operating or at rest. The sensing circuitry 170 can transmit the one or more measured characteristics to a battery management system 180. The battery management system can receive the one or more measured characteristics and determine the condition of the battery cell 102 based at least in part on the one or more measured characteristics.

Various models have been developed to model the electrochemical reactions occurring within the battery cell 102B. One example, was developed by Fuller, Doyle, and Newman, the (Newman Model), (*J. Electrochem. Soc.*, Vol. 141, No. 1, January 1994, pp. 1-10), the contents of which are hereby incorporated by reference in their entirety. The Newman Model provides a mathematical model which can be used to estimate the electrochemical processes occurring within the battery cell 102B based on the measured characteristics.

The charge transfer reactions at the anode 120, and cathode 150, as modelled by an electrochemical model can be used to describe various battery cell 102 parameters during both the charging and discharging of the battery cell 102. For example, various physical/chemical parameters might be estimated including, for example, anode particle radius; ion diffusion rates in the anode 120, cathode 150, and electrolyte; intercalation current and transference number; solution conductivity in the anode 120, cathode 150, and electrolyte; cell porosity of the anode 120 and cathode 150; and equilibrium potential of the anode 120 and cathode 150. When these physical/chemical parameters are estimated, they can be used to provide state information regarding the battery cell. For example, cathode particle radius can vary due to the degree of lithiation of the cathode 150 and, therefore, can be indicative of the state-of-charge of the battery cell 102.

Physics based electrochemical models, such as the Newman Model, may include numerous ordinary and partial differential equations to describe the behavior of the various parameters within the battery cell 102. The Newman Model accurately models many actual physics occurring in the Li-ion batteries. However, the full Newman Model is extremely complex and requires a large number of immeasurable physical parameters to be identified. Identification of such large set of parameters involved in the nonlinear PDE and DAEs with current computational capacity is impractical. This gives rise to various electrochemical models that approximate the dynamics of the Newman Model.

For example, the Reduced-Order-Model (ROM), Mayhew, C.; Wei He; Kroener, C.; Klein, R.; Chaturvedi, N.; Kojic, A., "Investigation of projection-based model-reduction techniques for solid-phase diffusion in Li-ion batteries," American Control Conference (ACC), 2014, pp. 123-128, 4-6 Jun. 2014, the contents of which are hereby incorporated by reference in their entirety, allows the model order reduction of the Newman Model of Li-ion cells while retaining the complete model structure of the of the baseline cell. The ROM of the Newman Model is able to accurately predict the truth model's behavior, compared to less realistic approximate models such as Single Particle Model, while reducing computation time and memory requirements. The Newman Model reduction by ROM, introduces a large number of states and parameters involved in highly nonlinear partial differential equations (PDEs) and differential algebraic equations (DAEs) of the ROM dynamical system. This contributes to the complexity of the parameter and state identification process. Herein we describe two methods of parameter and state estimation for the highly nonlinear and complex model of ROM. These models are based on online reception of measurement data and hence achieve a high speed of estimation.

The set of outputs from the electrochemical model via the Luenberger Observer include estimations of the rapidly varying states of the battery cell 102. In some embodiments the state of the battery cell 102 in combination with the present input to the mathematical model allows the model to predict the present output of the battery cell 102. States of a battery cell may for example include the state-of charge, for a lithium battery the degree of lithiation, or the hysteresis levels of the battery.

Parameters of the battery cell 102 are typically more slowly varying over time than the states of the battery cell 102. Additionally, a parameter may not be required for the model to predict the present output of the battery cell 102. Instead knowledge of the parameters of battery cell 102, which may be called the state-of-health of the battery, relate to the long term functioning of the battery cell 102. For example, the functioning of the battery cell 102 over one or more charge/discharge cycles. Additionally, some embodiments comprise parameters which are not directly determinable from the measurement of the current battery cell 102 characteristics. Examples of battery cell 102 parameters include the maximum power capacity, maximum power output, and internal resistance.

The set of outputs from the electrochemical model via the state and parameter estimators include estimations of both rapidly varying states of the battery cell 102 and estimations of slowly varying parameters of the battery cell 102. In some embodiments the state of the battery cell 102 in combination with the present input to the mathematical model allows the model to predict the present output of the battery cell 102. States of a battery cell may for example include the state-of charge, for a lithium battery the degree of lithiation, or the hysteresis levels of the battery. Parameters of the battery cell 102 are typically more slowly varying over time than the states of the battery cell 102. Additionally, a parameter may not be required for the model to predict the present output of the battery cell 102. Instead knowledge of the parameters of battery cell 102, which may be called the state-of-health of the battery, relate to the long term functioning of the battery cell 102. For example, the functioning of the battery cell 102 over one or more charge/discharge cycles. Additionally, some embodiments comprise parameters which are not directly determinable from the measurement of the current battery cell 102 characteristics. Examples of battery cell 102 parameters include the maximum power capacity, maximum power output, and internal resistance.

In some embodiments, to manage the battery system 100A (or the battery system 100B), the battery management system 180A (or the battery management system 180B with respect to the battery system 100B) receives at least one measured characteristic (e.g., a current and/or a voltage) of the at least one battery cell 102A from the at least one sensor (e.g., the sensing circuitry 170A as described above). The battery management system 180A estimates at least one state (e.g., a state-of-charge and/or a state-of-health) of the at least one battery cell 102A at a first time by applying an electrochemical-based battery model (e.g., applying a plurality of differential algebraic equations to provide a reduced-order-model (ROM) of a Newman Model) that accounts for physical parameters of a chemical composition of the at least one battery cell 102A.

The battery management system 180A estimates at least one physical parameter (e.g., the physical parameters as described above) of the at least one battery cell 102A based on the at least one measured characteristic and the estimation of the at least one state. The battery management system 180A also estimates the at least one state of the at least one battery cell 102A at a second time, subsequent to the first time, by applying the electrochemical-based battery model based on the estimated at least one parameter. The battery management system 180A regulates at least one of charging or discharging of the at least one battery cell 102A based on the estimation of the at least one state of the at least one battery cell. In other words, the battery management system 180A can perform a loop-based method as described in greater detail where physical parameters are iteratively estimated based on a state and states are iteratively estimated based on the parameters.

In estimating the at least one physical parameter of the at least one battery cell 102A, the battery management system 180A determines a linearized representation of the electrochemical-based battery model based on the estimated at least one state of the at least one battery cell 102A at the first time. For example, the battery management system 180A applies a state observer (e.g., a Luenberger state observer) to determine one or more regressor vectors based on the estimated at least one state at the first time and at least one estimated physical parameter from a previous time.

The battery management system 180A also converts the linearized representation of the electrochemical-based battery model into a scalar representation of the electrochemical-based battery model. For example, the battery management system 180A normalizes the one or more regressor vectors to generate corresponding one or more scalar outputs, wherein the one or more regressor vectors and the corresponding one or more scalar outputs are functions of the at least one measured characteristic, the estimation of the at least one state, and the initial parameters or the parameters from the previous time step.

The battery management system 180A also determines a scalar representation of the at least one physical parameter based on the scalar representation of the electrochemical-based battery model. The battery management system 180A also determines the estimated at least one parameter based on the scalar representation of the at least one physical parameter. For example, the battery management system 180A applies a linear recursive least square filter to the scalar representation of the electrochemical-based battery model to determine the scalar representation of the at least one physical parameter. Additionally, in some embodiments, the battery management system 180A maintains a constant cost of estimation and preventing unbounded estimation gains by applying a time varying forgetting factor to the scalar representation of the electrochemical-based battery model.

In some embodiments, the battery management system 180A determines a sensitivity covariance matrix that quantifies how highly two parameters or states as described above are coupled over dynamics of the battery system. The battery management system 180A can use the sensitivity covariance matrix to adjust the sensitivity of the battery system 100A.

Recursive Least Squares (RLS) is an adaptive filter which recursively finds the coefficients that minimize a weighted linear least squares cost function relating to the input signals. Adaptive filters, such as the Recursive Least Squares (RLS) provide a system with a linear filter that has a transfer function controlled by variable parameters a means to adjust those parameters. One advantage of RLS is extremely fast convergence.

Figure 3:
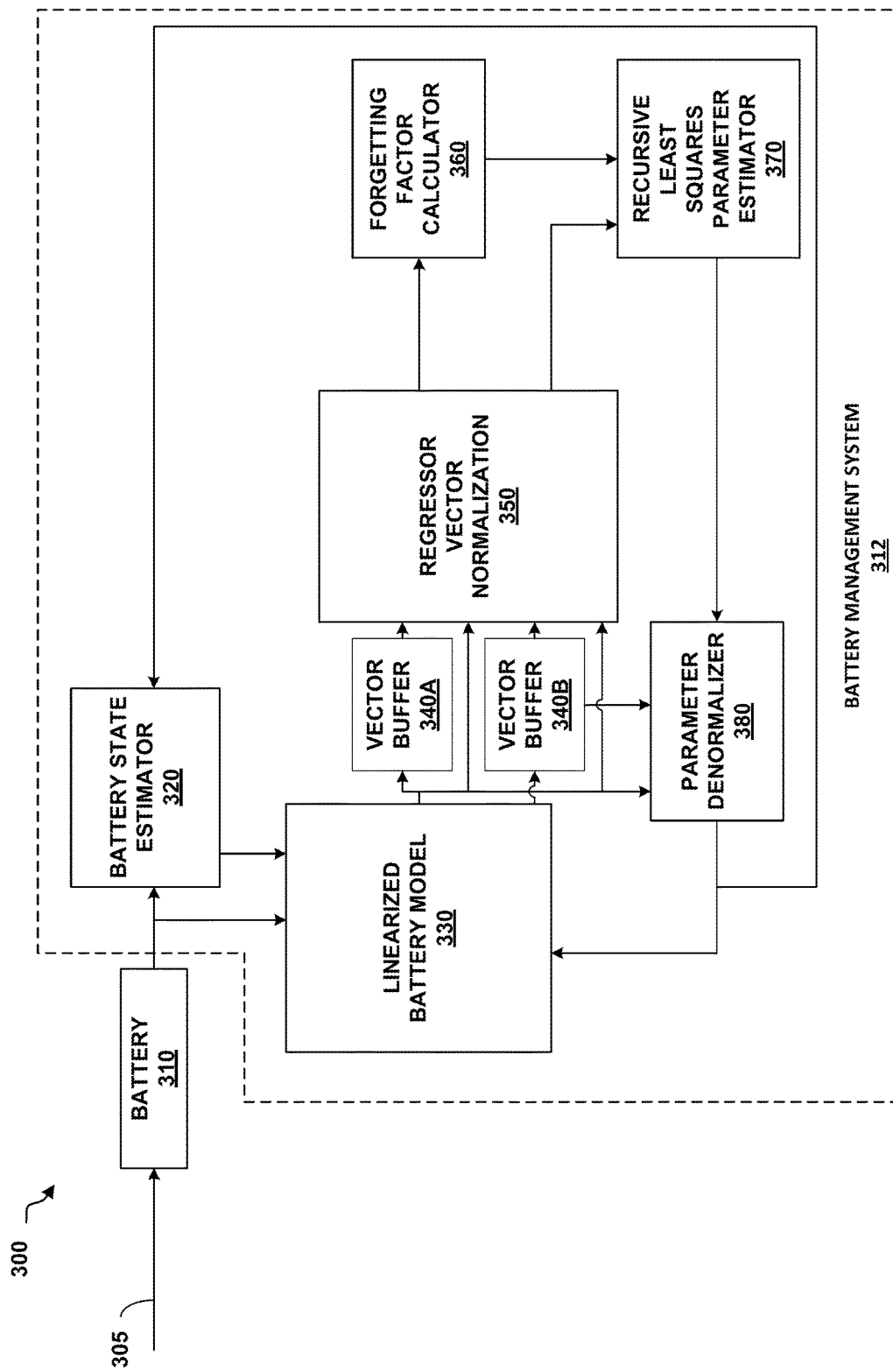
FIG. 3 is a functional block diagram of a battery system that applies a Luenberger Observer and Recursive Least Squares estimator to estimate physical parameters of the battery cell and battery state information, in accordance with another embodiment.

An example of a an implementation of a battery system having a Luenberger Observer and Recursive Least Squares Estimation is shown in FIG. 3. FIG. 3 illustrates a battery system 300, which includes a current 305, a battery 310, and a battery management system 312. The battery management system 312 includes a battery state estimator 320, a linearized battery model representation 330, vector buffers 340A and 340B, a regressor vector normalization 350, a forgetting factor calculator 360, a RLS parameter estimator 370, and a parameter denormalizer 380.

A Luenberger Observer and Recursive Least Squares (RLS) Estimation can be applied to various, electrochemical, physical, and mathematical models of the battery 310. In the example of FIG. 3, the battery 310 receives a current 305 and has at least one measureable characteristic (e.g., the current 305 and/or a voltage).

In the example of FIG. 3, the battery state estimator 320 and the linearized battery model 330 of the battery management system 312 receives at least one measured characteristic (e.g., the current 305 and/or a voltage) of the battery 310 from the at least one sensor (e.g., the sensing circuitry 170A as described above). The battery state estimator 320 of the battery management system 312 estimates at least one state of the battery 310 at a first time by applying an electrochemical-based battery model that accounts for physical parameters of a chemical composition of the battery 310. The linearized battery model 330 of the battery management system 312 estimates at least one physical parameter of the at least one battery cell based on the at least one measured characteristic and the estimation of the at least one state from the battery state estimator 320.

For example, in estimating at least one physical parameter of the battery 310, the linear battery model 330 is a state observer (e.g., a Luenberger state observer) applied by the battery management system 312 to determine one or more linearized regressor vectors based on the estimated at least one state from the battery state estimator 320 at the first time and at least one estimated physical parameter from a previous time (e.g., a historical estimated physical parameter). The one or more linearized regressor vectors are buffered by vector buffers 340A and 340B. The one or more linearized regressor vectors are normalized by the regressor vector normalization 350 to generate a scalar representation of the electrochemical-battery model. The recursive least squares parameter estimator 370 of the battery management system 312 determines a scalar representation of the at least one physical parameter by applying a linear recursive least square filter with a forgetting factor determined by the forgetting factor calculator 360 to the scalar representation of the electrochemical-based battery model. The parameter denormalizer 380 of the battery management system 312 determines an estimated value of the at least one physical parameter based on the scalar representation of the at least one physical parameter from the recursive least squares parameter estimator 370.

After determining the at least one physical parameter, the battery state estimator 320 of the battery management system 312 estimates the at least one state of the battery 310 at a second time, subsequent to the first time, by applying the electrochemical-based battery model based on the estimation of the at least one physical parameter. The battery management system 312 regulates at least one of charging or discharging of the battery based on the estimation of the at least one state of the battery.

A representation of the states and parameters of the battery 310 and the corresponding states and parameters of the model of the battery estimator 320 is provided in the Equations 1 and 2 respectively.

$$\dot{x}(t)=f(x(t),\theta,I(t))$$

$$0=g(x(t),\theta,I(t))$$

$$V(t)=h(x(t),\theta,I(t)) \quad (1)$$

$$\dot{\hat{x}}(\tau)=f(\hat{x}(\tau),\hat{\theta},I(\tau))$$

$$0=g(\hat{x}(\tau),\hat{\theta},I(\tau))$$

$$\hat{V}(\tau)=h(\hat{x}(\tau),\hat{\theta},I(\tau)) \quad (2)$$

In Equations 1 and 2, x represents the states, $\theta$ represents the parameters, I represents the current inputs, and V represents the voltage outputs.

The ROM's dynamic system model is composed of partial differential equations (PDE) and differential algebraic equations (DAE) that are nonlinear functions of the parameters and states. The Recursive Least Squares (RLS) parameter estimation approximates the system as a linear model that is valid around a given operating point. In one example the operating point includes the observed states at the current time and the current estimation of the parameters. The non-linear equations of the battery state estimator 320 are linearized versus the parameters to provide a linearized battery model representation 330. Some parameters may appear in multiple partial differential equations (PDE) and/or differential algebraic equations (DAE) which may result in an over-parameterization of the system. In certain embodiments this issue can be resolved by writing a set of linear equations that employ a logarithmic nonlinear transformation between the larger number of parameters appearing in PDE and DAEs and the real parameters of the system that have physical meanings. Linearization is achieved by using Taylor's series expansion of the nonlinear dynamical system of ROM versus parameters. An example of the linearized parameters is represented by Equations 3-5.

$$z(t)=\Phi(t)^T\theta \quad (3)$$

$$z(t)=\xi(\hat{x}(t),\hat{\theta},I(t),V(t)) \quad (4)$$

$$\Phi(t)=\eta(\hat{x}(t),\hat{\theta},I(t),V(t)) \quad (5)$$

In certain embodiments, the PDE and DAE equations are linearized and written in a linear parametric model format, where the dot-product of a regressor vector and the set of parameters gives a scalar output. The regressor vector and the scalar output are functions of the monitored input and output of the system, observed states, and estimated parameters in previous time step. According to the dynamics of ROM, we can employ high or low pass filters to the regressor vectors and the output of linear parametric model to increase the sensitivity of the system to the parameters being estimated.

The Recursive Least Squares (RLS) cost function includes a forgetting factor which decreases the contribution of older data relative to newer data. In some embodiments, a time varying forgetting factor can guarantee a constant cost of estimation and prevents the estimation gains from growing unboundedly.

The Recursive Least Squares estimator minimizes the cost function related to the input signals and calculates adaptive gains for the parameters. In order to improve the sensitivity of the estimation a sensitivity covariance matrix may be generated that quantifies how highly two parameters or states are coupled over the dynamics of the system. Sensitivity coefficients are dependent on the time at which the output is measured. If these coefficients, that determine the relation between the output and parameters and states, are linearly independent, then there exists only one unique set of parameter values. On the other hand, if the linear dependence between these coefficients is represented by larger (closer to one) off-diagonal values in a sensitivity covariance matrix, those parameters or states may be unidentifiable. For such highly coupled parameters or states, we either estimate one entry in each highly coupled set or find a mathematical relation between them that has appeared in the dynamics of the system and estimate the combination as a new parameter or state.

The embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling with the spirit and scope of this disclosure.

It is believed that embodiments described herein and many of their attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes.

While the invention has been described with reference to various embodiments, it will be understood that these embodiments are illustrative and that the scope of the disclosure is not limited to them. Many variations, modifications, additions, and improvements are possible. More generally, embodiments in accordance with the invention have been described in the context or particular embodiments. Functionality may be separated or combined in blocks differently in various embodiments of the disclosure or described with different terminology. These and other variations, modifications, additions, and improvements may fall within the scope of the disclosure as defined in the claims that follow.

What is claimed is:

1. A method of managing a battery system, the battery system including at least one battery cell, at least one sensor configured to measure at least one characteristic of the at least one battery cell, and a battery management system including a microprocessor and a memory, the method comprising
   receiving, by the battery management system, at least one measured characteristic of the at least one battery cell from the at least one sensor;
   estimating, by the battery management system, at least one state of the at least one battery cell at a first time by applying an electrochemical-based battery model that accounts for physical parameters of a chemical composition of the at least one battery cell;
   estimating, by the battery management system, at least one physical parameter of the at least one battery cell based on the at least one measured characteristic and the estimation of the at least one state;
   estimating, by the battery management system, the at least one state of the at least one battery cell at a second time, subsequent to the first time, by applying the electrochemical-based battery model based on the estimated at least one physical parameter; and
   regulating by the battery management system, at least one of charging or discharging of the at least one battery cell based on the estimation of the at least one state of the at least one battery cell,
   wherein estimating the at least one physical parameter of the at least one battery cell based on the at least one measured characteristic and the estimation of the at least one state includes
      determining, by the battery management system, a linearized representation of the electrochemical-based battery model based on the estimated at least one state of the at least one battery cell at the first time,
      converting the linearized representation of the electrochemical-based battery model into a scalar representation of the electrochemical-based battery model,
      determining, by the battery management system, a scalar representation of the at least one physical parameter based on the scalar representation of the electrochemical-based battery model, and
      determining, by the battery management system, the estimated at least one physical parameter based on the scalar representation of the at least one physical parameter, and
   wherein determining the linearized representation of the electrochemical-based battery model includes applying a state observer to determine one or more regressor vectors based on the estimated at least one state at the first time and at least one estimated physical parameter from a previous time.

2. The method of claim 1, wherein converting the linearized representation of the electrochemical-based battery model into the scalar representation of the electrochemical-based battery model includes normalizing the one or more regressor vectors to generate corresponding one or more scalar outputs, wherein the one or more regressor vectors and the corresponding one or more scalar outputs are functions of the at least one measured characteristic, the estimation of the at least one state, and initial parameters or the parameters from a previous time step.

3. The method of claim 1, wherein determining the estimated at least one physical parameter based on the scalar representation of the at least one physical parameter includes applying a linear recursive least square filter to the scalar representation of the electrochemical-based battery model to determine the scalar representation of the at least one physical parameter.

4. The method of claim 3, wherein determining the estimated at least one physical parameter based on the scalar representation of the at least one physical parameter further includes maintaining a constant cost of estimation and preventing unbounded estimation gains by applying a time varying forgetting factor to the scalar representation of the electrochemical-based battery model.

5. A method of managing a battery system, the battery system including at least one battery cell, at least one sensor configured to measure at least one characteristic of the at least one battery cell, and a battery management system including a microprocessor and a memory, the method comprising
   receiving, by the battery management system, at least one measured characteristic of the at least one battery cell from the at least one sensor;
   estimating, by the battery management system, at least one state of the at least one battery cell at a first time by applying an electrochemical-based battery model that accounts for physical parameters of a chemical composition of the at least one battery cell;

estimating, by the battery management system, at least one physical parameter of the at least one battery cell based on the at least one measured characteristic and the estimation of the at least one state;

estimating, by the battery management system, the at least one state of the at least one battery cell at a second time, subsequent to the first time, by applying the electrochemical-based battery model based on the estimated at least one physical parameter; and regulating by the battery management system, at least one of charging or discharging of the at least one battery cell based on the estimation of the at least one state of the at least one battery cell, wherein estimating the at least one physical parameter of the at least one battery cell includes:

applying a state observer to determine one or more linearized regressor vectors based on the estimated at least one state at the first time and at least one estimated physical parameter from a previous time, normalizing the one or more linearized regressor vectors to generate a scalar representation of the electrochemical-based battery model, determine a scalar representation of the at least one physical parameter by applying a linear recursive least square filter with a forgetting factor to the scalar representation of the electrochemical-based battery model, and determining an estimated value of the at least one physical parameter based on the scalar representation of the at least one physical parameter.

6. A method of managing a battery system, the battery system including at least one battery cell, at least one sensor configured to measure at least one characteristic of the at least one battery cell, and a battery management system including a microprocessor and a memory, the method comprising receiving, by the battery management system, at least one measured characteristic of the at least one battery cell from the at least one sensor;

estimating, by the battery management system, at least one state of the at least one battery cell at a first time by applying an electrochemical-based battery model that accounts for physical parameters of a chemical composition of the at least one battery cell;

estimating, by the battery management system, at least one physical parameter of the at least one battery cell based on the at least one measured characteristic and the estimation of the at least one state;

estimating, by the battery management system, the at least one state of the at least one battery cell at a second time, subsequent to the first time, by applying the electrochemical-based battery model based on the estimated at least one physical parameter;

regulating by the battery management system, at least one of charging or discharging of the at least one battery cell based on the estimation of the at least one state of the at least one battery cell; and quantifying, with a sensitivity covariance matrix, how highly two parameters or states are coupled over dynamics of the battery system.

7. A method of managing a battery system, the battery system including at least one battery cell, at least one sensor configured to measure at least one characteristic of the at least one battery cell, and a battery management system including a microprocessor and a memory, the method comprising receiving, by the battery management system, at least one measured characteristic of the at least one battery cell from the at least one sensor;

estimating, by the battery management system, at least one state of the at least one battery cell at a first time by applying an electrochemical-based battery model that accounts for physical parameters of a chemical composition of the at least one battery cell;

estimating, by the battery management system, at least one physical parameter of the at least one battery cell based on the at least one measured characteristic and the estimation of the at least one state;

estimating, by the battery management system, the at least one state of the at least one battery cell at a second time, subsequent to the first time, by applying the electrochemical-based battery model based on the estimated at least one physical parameter; and regulating by the battery management system, at least one of charging or discharging of the at least one battery cell based on the estimation of the at least one state of the at least one battery cell, wherein estimating the at least one state of the at least one battery cell at the first time by applying the electrochemical-based battery model includes applying a plurality of differential algebraic equations to provide a reduced-order-model of a Newman electrochemical battery model.

8. The method of claim 7, wherein receiving the at least one measured characteristic of the at least one battery cell from the at least one sensor includes receiving at least one of a current measurement or a voltage measurement of the at least one battery cell.

9. The method of claim 7, wherein the at least one state of the at least one battery cell includes at least one of a state-of-charge or a state-of-health of the at least one battery cell.

10. A battery management system comprising a processor and a memory storing instructions that, when executed by the processor, cause the battery management system to:

receive at least one measured characteristic of at least one battery cell from at least one sensor, the at least one measured characteristic including a characteristic selected from a group consisting of a current measurement of the at least one battery cell and a voltage measurement of the at least one battery cell;

estimate at least one state of the at least one battery cell at a first time by applying a electrochemical-based battery model that account for physical parameters of a chemical composition of the at least one battery cell;

estimate at least one physical parameter of the at least one battery cell based on the at least one measured characteristic and the estimation of the at least one state;

estimate the at least one state of the at least one battery cell at a second time, subsequent to the first time, by applying the electrochemical-based battery model based on the estimated at least one physical parameter; and regulate at least one of charging or discharging of the at least one battery cell based on the estimation of the at least one state of the at least one battery cell, wherein the instructions, when executed by the processor, cause the battery management system to estimate the at least one physical parameter of the at least one battery cell based on the at least one measured characteristic and the estimation of the at least one state by
determining a linearized representation of the electrochemical-based battery model based on the estimated at least one state of the at least one battery cell at the first time,
converting the linearized representation of the electrochemical-based battery model into a scalar representation of the electrochemical-based battery model,
determining a scalar representation of the at least one physical parameter based on the scalar representation of the electrochemical-based battery model, and
determining the estimated at least one physical parameter based on the scalar representation of the at least one physical parameter, and
wherein the instructions, when executed by the processor, cause the battery management system to determine the linearized representation of the electrochemical-based battery model by applying a state observer to determine one or more regressor vectors based on the estimated at least one state at the first time and at least one estimated physical parameter from a previous time.

11. The battery management system of claim 10, wherein the instructions, when executed by the processor, cause the battery management system to convert the linearized representation of the electrochemical-based battery model into the scalar representation of the electrochemical-based battery model by normalizing the one or more regressor vectors to generate corresponding one or more scalar outputs, wherein the one or more regressor vectors and the corresponding one or more scalar outputs are functions of the at least one measured characteristic, the estimation of the at least one state, and initial parameters or the parameters from a previous time step.

12. The battery management system of claim 10, wherein the instructions, when executed by the processor, cause the battery management system to determine the estimated at least one physical parameter based on the scalar representation of the at least one physical parameter by applying a linear recursive least square filter to the scalar representation of the electrochemical-based battery model to determine the scalar representation of the at least one physical parameter.

13. The battery management system of claim 12, wherein the instructions, when executed by the processor, cause the battery management system to determine the estimated at least one physical parameter based on the scalar representation of the at least one physical parameter further by maintaining a constant cost of estimation and preventing unbounded estimation gains by applying a time varying forgetting factor to the scalar representation of the electrochemical-based battery model.

14. A battery management system comprising a processor and a memory storing instructions that, when executed by the processor, cause the battery management system to:
receive at least one measured characteristic of at least one battery cell from at least one sensor, the at least one measured characteristic including a characteristic selected from a group consisting of a current measurement of the at least one battery cell and a voltage measurement of the at least one battery cell;
estimate at least one state of the at least one battery cell at a first time by applying a electrochemical-based battery model that account for physical parameters of a chemical composition of the at least one battery cell;
estimate at least one physical parameter of the at least one battery cell based on the at least one measured characteristic and the estimation of the at least one state;
estimate the at least one state of the at least one battery cell at a second time, subsequent to the first time, by applying the electrochemical-based battery model based on the estimated at least one physical parameter; and
regulate at least one of charging or discharging of the at least one battery cell based on the estimation of the at least one state of the at least one battery cell,
wherein the instructions, when executed by the processor, cause the battery management system to estimate the at least one physical parameter of the at least one battery cell by:
applying a state observer to determine one or more linearized regressor vectors based on the estimated at least one state at the first time and at least one estimated physical parameter from a previous time,
normalizing the one or more linearized regressor vectors to generate a scalar representation of the electrochemical-based battery model,
determine a scalar representation of the at least one physical parameter by applying a linear recursive least square filter with a forgetting factor to the scalar representation of the electrochemical-based battery model, and
determining an estimated value of the at least one physical parameter based on the scalar representation of the at least one physical parameter.

15. A battery management system comprising a processor and a memory storing instructions that, when executed by the processor, cause the battery management system to:
receive at least one measured characteristic of at least one battery cell from at least one sensor, the at least one measured characteristic including a characteristic selected from a group consisting of a current measurement of the at least one battery cell and a voltage measurement of the at least one battery cell;
estimate at least one state of the at least one battery cell at a first time by applying a electrochemical-based battery model that account for physical parameters of a chemical composition of the at least one battery cell;
estimate at least one physical parameter of the at least one battery cell based on the at least one measured characteristic and the estimation of the at least one state;
estimate the at least one state of the at least one battery cell at a second time, subsequent to the first time, by applying the electrochemical-based battery model based on the estimated at least one physical parameter; and
regulate at least one of charging or discharging of the at least one battery cell based on the estimation of the at least one state of the at least one battery cell,
wherein the instructions, when executed by the processor, cause the battery management system to estimate the at least one state of the at least one battery cell at the first time by applying the electrochemical-based battery model by
applying a plurality of differential algebraic equations to provide a reduced-order-model of a Newman electrochemical battery model.

16. The battery management system of claim 15, wherein the instructions, when executed by the processor, cause the battery management system to estimate the at least one state of the at least one battery cell by estimating a state-of-charge and a state-of-health of the at least one battery cell.

* * * * *